(12) United States Patent
Tong et al.

(10) Patent No.: US 6,298,461 B1
(45) Date of Patent: Oct. 2, 2001

(54) ENCODING AND DECODING METHODS AND APPARATUS

(75) Inventors: Wen Tong; Rui Wang, both of Ottawa (CA); Vitali B. Kreindeline, Moskva (RU); Mikhail G. Bakouline, Moskovskaja (RU); Alexandre M. Chloma, Koskovskaja (RU); Yuri S. Shinakov, Moscow (RU)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/236,070

(22) Filed: Jan. 25, 1999

(30) Foreign Application Priority Data

Apr. 6, 1998 (CA) .................................................. 2234006

(51) Int. Cl.$^7$ .................................................. H03M 13/00
(52) U.S. Cl. ............................ 714/755; 714/784; 714/795
(58) Field of Search ...................... 714/755, 786, 714/746, 760, 784, 792–794, 795, 788; 455/12.1, 21; 370/342, 494, 463, 467, 496; 375/130, 261–262; 341/107; 379/90.01, 93.08

(56) References Cited

U.S. PATENT DOCUMENTS

| | | | |
|---|---|---|---|
| 5,721,746 | * 2/1998 | Hladik et al. | 714/792 |
| 5,734,962 | * 3/1998 | Hladik et al. | 455/12.1 |
| 6,029,264 | * 2/2000 | Kobayashi et al. | 714/755 |
| 6,167,552 | * 12/2000 | Gagnon et al. | 714/793 |
| 6,175,940 | * 1/2001 | Saunders | 714/746 |

OTHER PUBLICATIONS

Atkin, et al. (Orthogonal convolutional coding for the PPM optical channel ; IEEE, Apr. 1989).*

Justesen, J. et al. (Concatenated codes with convolutional inner codes; IEEE, Sep. 1988).*

Nissopoulos et al. (Preliminary results on performance evaluation of concatenated coding schemes over Rayleigh fading ionospheric channels; IEEE, 1994).*

Berrou, C. et al. (An IC for turbo–codes encoding and decoding; IEEE, Feb. 17, 1995).*

Papke, L. et al. (Combined multilevel Turbo–code with MR–modulation; IEEE, Jun. 22, 1995).*

Reed et al. (Turbo–code termination schemes and a novel alternative for short frames; IEEE, Oct. 18, 1996).*

Golanbari, M. et al. (Channel coding for coherent lightwave FSK communications deteriorated by phase noise; IEEE, Jun. 1992).*

Claude Berrou et al., Near Shannon Limit Error–Correcting Coding and Decoding: Turbo–codes (1), (1993), pp 1064–1070.

L. R. Bahl et al., Optimal Decoding of Linear Codes for Minimizing Symbol Error Rate, (1974), pp 2–5.

* cited by examiner

Primary Examiner—Albert Decady
Assistant Examiner—Guy J. Lamarre
(74) Attorney, Agent, or Firm—Dennis R. Haszko; Smart & Biggar

(57) ABSTRACT

An encoder for a wideband CDMA communications system comprises an outer Reed-Solomon code encoder and an inner parallel concatenated convolutional code (PCCC) or turbo code encoder. An iterative PCCC decoder, for decoding the inner code, includes summing functions in forward and feedback paths for producing extrinsic information to enhance soft decoding decisions by first and second decoders in successive decoding iterations. An outer code decoder connected following the PCCC decoder also can provide serial feedback information for enhancing iterative decisions by the PCCC decoder.

9 Claims, 2 Drawing Sheets

ENCODING AND DECODING METHODS AND APPARATUS

This invention relates to encoding and decoding methods and apparatus. The invention can be applied to various systems which may be used for example for the communication or storage of signals, but is particularly applicable to, and is described below in the context of, CDMA (code division multiple access) communications which are increasingly being used in cellular wireless communications systems. As can be fully appreciated from the description below, the term "decoding" is used herein to embrace not only the function of decoding but also, where applicable, the functions of demodulation or other detection of a signal using soft and/or hard decisions, and the term "decoder" is used correspondingly.

BACKGROUND

A class of parallel concatenated convolutional codes, also known as PCCCs or turbo codes, is known for example from an article by C. Berrou et al. entitled "Near Shannon Limit Error-Correcting Coding And Decoding: Turbo-Codes", Proceedings of the IEEE International Conference on Communications, 1993, pages 1064–1070. That article showed that a turbo code together with an iterative decoding algorithm could provide performance in terms of BER (Bit Error Rate) that is close to the theoretical limit. A turbo code encoder provides a parallel concatenation of two (or more) RSC (Recursive Systematic Convolutional) codes which are typically, but not necessarily, identical, applied to an input bit sequence and an interleaved version of this input bit sequence. The output of the encoder comprises systematic bits (the input bit sequence itself) and parity bits which can be "punctured" (selected) to provide a desired rate of encoding.

Various schemes are being proposed and developed to provide, especially for the communication of data in a CDMA (code division multiple access) communications system a greater bandwidth (signal transmission rate) than is provided in a so-called IS-95 system which is compatible with TIA/EIA (Telecommunications Industry Association/Electronic Industries Association) Interim Standard IS-95-A, "Mobile Station-Base Station Compatibility Standard for Dual-Mode Wideband Spread Spectrum Cellular System". Turbo coding has been proposed for such WCDMA (wideband CDMA) systems. However, turbo coding does not provide a great increase in code distance, which is a significant disadvantage for a BER of less than about $10^{-5}$ which is desirable for WCDMA systems.

It is desirable to optimize the application of turbo coding to WCDMA systems, in order to obtain maximum coding gains.

An object of this invention is to provide improved encoding and decoding methods and apparatus.

SUMMARY OF THE INVENTION

One aspect of this invention provides a method of encoding information comprising: a first step of encoding said information in accordance with an outer code to produce encoded information; and a subsequent step of encoding said encoded information in accordance with an inner code in a parallel concatenated convolutional code encoder. Preferably the first step comprises Reed-Solomon encoding.

Another aspect of the invention provides encoding apparatus comprising a first encoder for encoding information in accordance with an outer code serially concatenated with a second encoder for encoding in accordance with an inner code the information encoded by the first encoder, the second encoder comprising a parallel concatenated convolutional code encoder comprising an interleaver for interleaving the information encoded by the first encoder and two recursive systematic convolutional encoders for encoding the information encoded by the first encoder at an input and an output of the interleave).

A further aspect of the invention provides parallel concatenated convolutional code decoding apparatus comprising: a first convolutional code decoder for providing soft decoding decisions of at least one input signal comprising systematic and parity information; an interleaver; a second convolutional code decoder for providing soft decoding decisions in response to an output from the first decoder derived via the interleaver and a further input signal comprising parity information, and a parallel feedback path including a deinterleaver for feeding back to the first decoder information derived from the second decoder for enhancing soft decoding decisions by the first decoder in at least one subsequent decoding iteration; characterized by further comprising summing functions in the paths from the first decoder to the interleaver and from the second decoder to the deinterleaver for subtracting information from the output of the deinterleaver and interleaver respectively to produce extrinsic information for supply to the interleaver and deinterleaver respectively.

Yet another aspect of the invention provides a method of decoding information encoded by the method recited above, comprising the steps of decoding a parallel concatenated convolutional code (PCCC) encoded signal using an iterative PCCC decoder to produce soft decoder decisions, decoding the soft decoder decisions using a soft outer code decoder, and enhancing the iterative decoding by the PCCC decoder using information fed back from the Soft outer code decoder.

BRIEF DESCRIPTION OF THE DRAWINGS

The invention will be further understood from the following description with reference to the accompanying drawings, in which.

DETAILED DESCRIPTION

Figure 1:
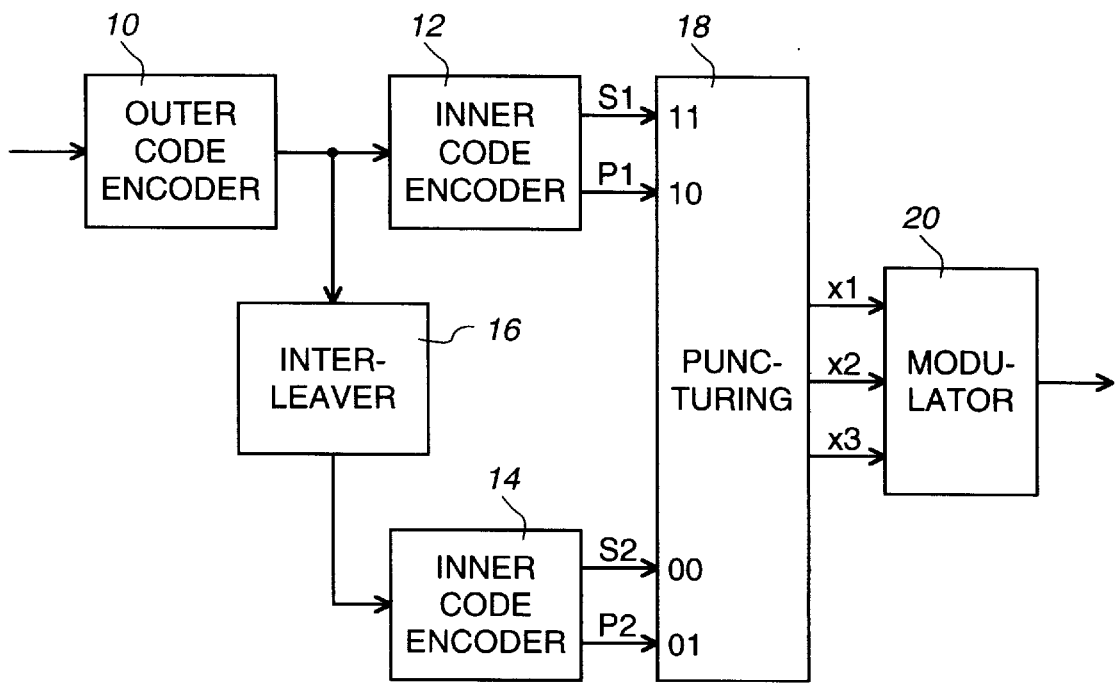
FIG. 1 illustrates a block diagram of a concatenated turbo code encoder in accordance with an embodiment of this invention.

As discussed above, turbo coding does not provide a great increase in code distance. In the encoder of FIG. 1 this disadvantage is avoided by serially concatenating an outer code with an inner turbo code.

Referring to FIG. 1, the encoder comprises an outer code encoder which is serially concatenated with an inner PCCC or turbo code encoder which is constituted in known manner by two encoders 12 and 14 whose inputs are separated by a block interleaver 16. The outputs of the encoders 12 and 14 are selected or punctured by a puncturing block or selector 18, the output of which is supplied to a modulator 20 to produce modulated information for transmission.

In a preferred form of the encoder of FIG. 1, the outer code is a Reed-Solomon (RS) code, which has the advantages that it provides a maximal code distance for given code parameters and that sophisticated decoding method are known. An information sequence supplied to the outer code encoder 10 is encoded in accordance with a desired RS code in known manner, and the resulting encoded bit sequences are supplied to the inner code encoder 12 directly and to the inner code encoder 14 via the interleaver 16. For example, the desired RS code may be a (15,9) code with the generating polynomial:

$$g(x)=x^6+\alpha^{10}x^5+\alpha^{14}x^4+\alpha^4x^3+\alpha^6x^2+0x+\alpha^6 \quad (1)$$

where $\alpha$ is a primitive element of the Galois filed GF (16) having the 16-element alphabet 0, $\alpha^0$, $\alpha^1$, $\alpha^2$, ... $\alpha^{14}$.

The inner code encoders 12 and 14 are preferably identical RSC (recursive systematic convolutional) encoders which may for example be rate ½ encoders operating in accordance with a generation matrix G(D) given by:

$$G(D) = \left[\frac{1+D^2+D^3+D^4}{1+D+D^4}\right] \quad (2)$$

Each of the encoders 12 and 14 produces at its outputs both systematic bits S, constituted directly by information bits supplied to the input of the encoder, and parity bits which are produced by the encoding operation of the encoder. In the case of rate ½ encoders as described and illustrated here, for each information bit supplied to the input of the encoder 12 or 14 the encoder produces this information bit at its output as a systematic bit S1 or S2 respectively, and also produces by its encoding operation a parity bit P1 or P2 respectively so that there are two output bits for each input information bit (i.e. rate ½).

Figure 2:
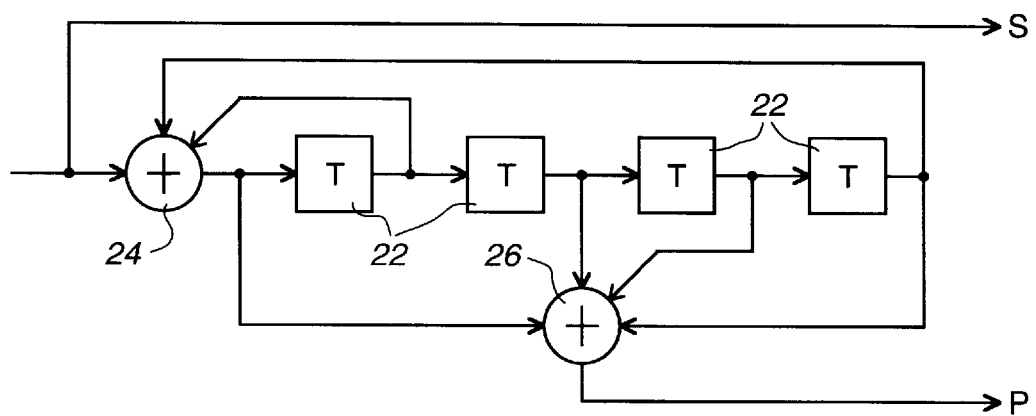
FIG. 2 illustrates a block diagram of an RSC encoder which may be used in the encoder of FIG. 1.

An implementation of each RSC encoder 12 or 14 is illustrated in FIG. 2, comprising four delay elements 22 each providing a delay T of one information bit period, and two modulo-2 adders 24 and 26. The systematic bit S is produced directly from the input, and the parity bit P is produced at the output of the adder 26.

The systematic and parity bits produced by the encoders 12 and 14 are supplied to the puncturing block 18 in the encoder of FIG. 1. These bits S1, P1 and S2, P2 are selected and passed by the puncturing block 18 in accordance with respective 2-bit puncturing codes that are shown in FIG. 1 at the respective inputs of this block. Thus the non-interleaved systematic bits S1 are all selected (code 11) to produce output bits x1, none of the interleaved systematic bits S12 are selected (code 00), and the parity bits P1 and P2 are selected alternately (codes 10 and 01 respectively) to produce output bits x2 and x3 respectively. Consequently, the block 18 selects four bits (two S1, one P1, and one P2) for every two information bits supplied to the input of the turbo coder, so that the entire turbo coder provides rate ½ encoding. The output bits x1, x2, and x3 of the puncturing block 18 are supplied to the modulator 20, which can operate in accordance with any desired modulation scheme, such as BPSK (binary phase shift keying).

Figure 3:
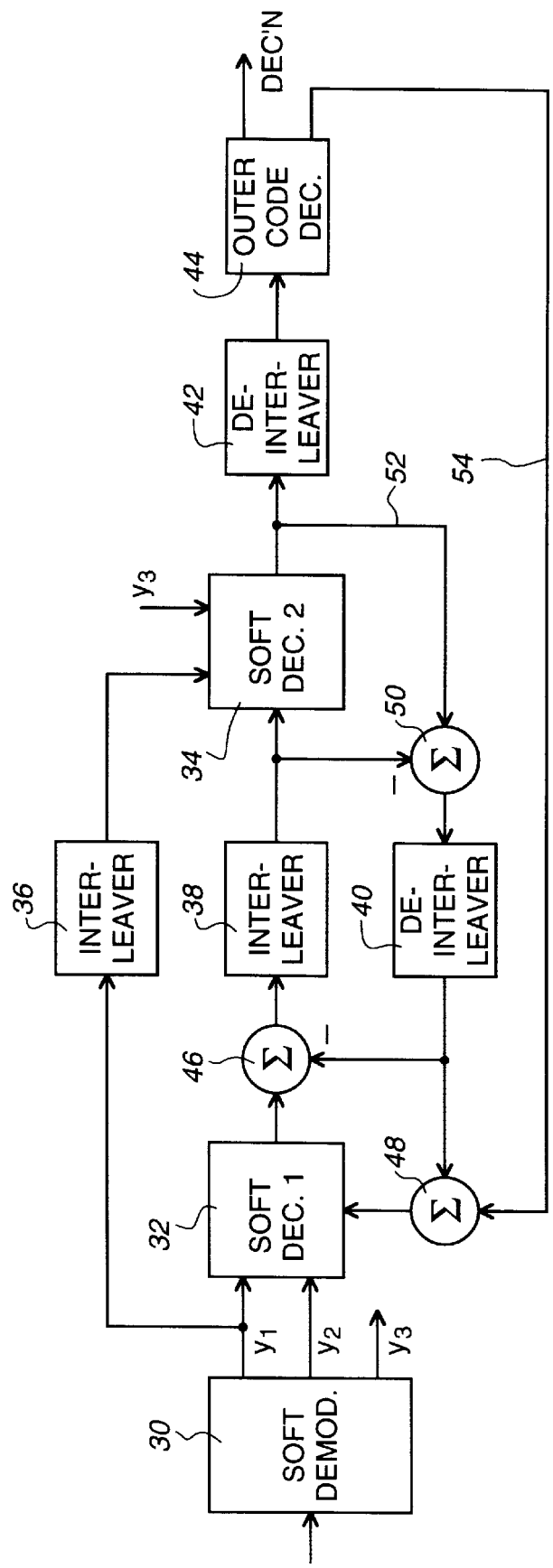
FIG. 3 illustrates a block diagram of a concatenated turbo code decoder in accordance with another embodiment of this invention.

FIG. 3 illustrates a decoder in accordance with another embodiment of this invention, for decoding information encoded by a serially concatenated RS outer encoder and a turbo code inner encoder for example as described above with reference to FIGS. 1 and 2. Referring to FIG. 3, the decoder comprises a soft demodulator 30, first and second RSC decoders 32 and 34, interleavers 36 and 38, deinterleavers 40 and 42, an RS decoder 44, and summing functions 46, 48, and 50.

The demodulator 30 has soft demodulation outputs y1, y2, and y3 corresponding respectively to the bits x1, x2, and x3;

thus the soft demodulation output y1 represents (non-interleaved) systematic bits and the soft demodulation outputs y2 and y3 represent the parity bits for the non-interleaved path (encoder 12) and the interleaved path (interleaver 16 and encoder 14) of the turbo code encoder of FIG. 1. As is well known, each soft output or soft decision for a respective bit is a probability that the bit is a binary 0 or 1, or a ratio of such probabilities or a maximum likelihood ratio.

The units 32, 34, 36, 38, 40, 46, and 48 of FIG. 3 constitute a turbo inner code decoder having a parallel feedback path 52 for iterative decoding in successive passes through the decoder. The general nature of turbo or iterative decoding is known for example from the article by C. Berrou et al. referred to above. Each iteration or pass of information through the decoders 32 and 34 serves to enhance soft decisions produced by the decoders for the received signals in each frame of interleaved blocks, so that a few iterations can provide a substantial error correction if the input signals to the decoder and so-called extrinsic information are uncorrelated. Extrinsic information is a likelihood or probability function of redundant information introduced by the encoding process, and is also explained for example in the article by C. Berrou et al. By way of example, each of the soft decision decoders 32 and 34 can perform maximal a posteriori probability (MAP) decoding in accordance with a so-called BCJR algorithm known for example from an article by L. R. Bahl et al. entitled "Optimal Decoding of Linear Codes for Minimizing Symbol Error Rate", IEEE Transactions on Information Theory, vol. IT-20, pages 248–287, March 1974. Alternatively the decoders 32 and 34 may perform maximum MAP (MAX-MAP) decoding or Soft-Output Viterbi Algorithm (SOVA) decoding which are also known in the art.

The non-interleaved soft demodulation outputs y1 and y2 are supplied to the first decoder 32, whose soft decision outputs in a first pass through the decoder are supplied via the summing function 46 to the interleaver 38, where they are interleaved in the same manner as in the interleaver 16 in the encoder of FIG. 1. The soft demodulation output y1 representing systematic bits is also similarly interleaved by the interleaver 36, and the outputs of the interleavers 36 and 38, and the (interleaved) soft demodulation output y3 of the demodulator 30, are supplied to the second decoder 34. The soft decisions produced by the second decoder 34 are fed back on the parallel feedback path 52 to the summing function 50, to a subtracting input of which the output of the interleaver 38 is also supplied, so that the summing function 50 produces feedback extrinsic information which is supplied to and deinterleaved by the deinterleaver 40.

In one or more subsequent decoding iterations, the extrinsic information from the output of the deinterleaver 40 is supplied via the summing function 48 (discussed further below) to be used by the first decoder 32 to enhance its soft decoding decisions, and is supplied to a subtractive input of the summing function 46 to provide forward extrinsic information which is interleaved by the interleaver 38 and used by the second decoder 34 to enhance its soft decoding decisions.

The soft decoding decisions of the second decoder 34 are also deinterleaved by the deinterleaver 42 and supplied to the outer code decoder 44, which in a preferred embodiment of the invention is a soft decision RS decoder for decoding the outer RS code. The soft decision outputs of this decoder 44 are optionally supplied to a serial feedback path 54 to the summing function 48, so that this information is combined with the parallel feedback extrinsic information supplied to the first decoder 32 to further enhance its soft decisions in a further iterative process.

After a desired number of iterations, a hard (binary) output which constitutes the final decision output of the overall decoder is produced by the outer code decoder 44 by comparing each respective soft decision with a threshold. Conveniently each soft decision is a number whose magnitude represents probability and whose sign represents whether this probability refers to a 0 or 1 bit, in which case the threshold comparison can be constituted by a sign function in the decoder 44.

Although not illustrated in FIG. 3, it can be appreciated that weighting functions can be provided as desired or necessary in the paths to any of the summing functions 46, 48, and 50.

Instead of deriving the input to the decoder 44 from the output of the second decoder 34 via the deinterleaver 42, it could be derived directly from the output of the first decoder 32. The serial feedback path could instead be coupled to the second decoder 34.

Although the functions of the encoder of FIGS. 1 and 2 and the decoder of FIG. 2 are represented as separate units, it should be appreciated that these functions can be implemented by functions of one or more digital signal processors (DSPs) and/or application specific integrated circuits (ASICs).

In addition, although as indicated above the invention can be of particular advantage in WCDMA communications systems, it can be appreciated that the principles of the invention can also be applied advantageously in other types of communications system, especially for example in satellite wireless communications systems.

Thus although specific embodiments of the invention have been described above, it can be appreciated that numerous modifications, variations, adaptations and combinations of the aspects thereof may be made within the scope of the invention as defined in the claims.

What is claimed is:

1. A parallel concatenated convolutional code decoding apparatus comprising:

a first convolutional code decoder for providing soft decoding decisions of at least one input signal comprising systematic and parity information;

an interleaver;

a second convolutional code decoder for providing soft decoding decisions in response to an output from the first decoder derived via the interleaver and a further input signal comprising parity information; and a parallel feedback path including a deinterleaver for feeding back to the first decoder information derived from the second decoder for enhancing soft decoding decisions by the first decoder in at least one subsequent decoding iteration;

characterized by further comprising summing functions in the paths from the first decoder to the interleaver and from the second decoder to the deinterleaver for subtracting information from the output of the deinterleaver and interleaver respectively to produce extrinsic information for supply to the interleaver and deinterleaver respectively.

2. The apparatus as claimed in claim 1 and further comprising an outer code decoder responsive to soft decoder decisions produced by the first decoder or deinterleaved soft decisions produced by the second decoder.

3. The apparatus as claimed in claim 1 and further comprising an interleaver via which said systematic information is also supplied to the second decoder.

4. The apparatus as claimed in claim 3 and further comprising an outer code decoder responsive to soft decoder decisions produced by the first decoder or deinterleaved soft decisions produced by the second decoder.

5. The apparatus as claimed in claim 4 wherein the outer code decoder comprises a Reed-Solomon decoder.

6. The apparatus as claimed in claim 4 and further comprising a serial feedback path from the outer code decoder to the first or second decoder for enhancing soft decisions by the first or second decoder.

7. The apparatus as claimed in claim 6 wherein the outer code decoder comprises a Reed-Solomon decoder.

8. A method of decoding information encoded by a method comprising a first step of encoding the information in accordance with an outer code to produce encoded information and a subsequent step of encoding said encoded information in accordance with an inner code in a parallel concatenated convolutional code (PCCC) encoder to produce a PCCC encoded signal, the method of decoding comprising the steps of decoding the PCCC encoded signal using an iterative PCCC decoder to produce soft decoder decisions decoding the soft decoder decisions using a soft outer code decoder, and enhancing the iterative decoding by the PCCC decoder using information fed back from the soft outer code decoder.

9. The method of claim 8 wherein the step of decoding the soft decoder decisions using the soft outer code decoder comprises Reed-Solomon decoding.

* * * * *